United States Patent
Ogawa et al.

(10) Patent No.: US 6,884,699 B1
(45) Date of Patent: Apr. 26, 2005

(54) PROCESS AND UNIT FOR PRODUCTION OF POLYCRYSTALLINE SILICON FILM

(75) Inventors: Tetsuya Ogawa, Hyogo (JP); Hidetada Tokioka, Hyogo (JP); Junichi Nishimae, Hyogo (JP); Tatsuki Okamoto, Hyogo (JP); Yukio Sato, Hyogo (JP); Mitsuo Inoue, Hyogo (JP); Mitsutoshi Miyasaka, Nagano (JP); Hiroaki Jiroku, Nagano (JP)

(73) Assignees: Mitsubishi Denki Kabushiki Kaisha, Tokyo (JP); Seiko Epson Corporation, Tokyo (JP)

( * ) Notice: Subject to any disclaimer, the term of this patent is extended or adjusted under 35 U.S.C. 154(b) by 143 days.

(21) Appl. No.: 10/148,562

(22) PCT Filed: Oct. 6, 2000

(86) PCT No.: PCT/JP00/07010

§ 371 (c)(1),
(2), (4) Date: Jun. 3, 2002

(87) PCT Pub. No.: WO02/31871

PCT Pub. Date: Apr. 18, 2002

(51) Int. Cl.$^7$ .................. H01L 21/00; H01L 21/336; H01L 21/331; H01L 21/20; H01L 21/26
(52) U.S. Cl. ............. 438/489; 438/97; 438/164; 438/166; 438/308; 438/378; 438/487; 438/489; 438/795; 438/969
(58) Field of Search ................. 438/97, 164, 166, 438/308, 378, 487, 489, 795, 969

(56) References Cited

U.S. PATENT DOCUMENTS

| | | | | |
|---|---|---|---|---|
| 5,366,926 A | * | 11/1994 | Mei et al. | 438/487 |
| 5,766,989 A | * | 6/1998 | Maegawa et al. | 438/166 |
| 5,811,327 A | * | 9/1998 | Funai et al. | 438/166 |
| 6,190,949 B1 | * | 2/2001 | Noguchi et al. | 438/149 |
| 6,437,284 B1 | | 8/2002 | Okamoto et al. | |
| 6,566,683 B1 | | 5/2003 | Ogawa et al. | |
| 6,596,613 B1 | * | 7/2003 | Kusumoto et al. | 438/487 |
| 6,607,971 B1 | * | 8/2003 | Moriguchi et al. | 438/487 |
| 6,608,326 B1 | * | 8/2003 | Shinagawa et al. | 257/64 |
| 2002/0068391 A1 | * | 6/2002 | Jung | 438/166 |

FOREIGN PATENT DOCUMENTS

| | | |
|---|---|---|
| JP | 2000-260731 | 9/2000 |
| JP | 2000-269133 | 9/2000 |

OTHER PUBLICATIONS

U.S. patent application Ser. No. 09/599,645, Okamoto et al., filed Jun. 13, 2000.
U.S. patent application Ser. No. 09/674,645, filed Nov. 2, 2000.
Ogawa, T. et al.; "Thin Film Transistors of Polysilicon Recrystallized . . . Q–Switched Nd:YAG Laser", EuroDisplay '99, pp. 81–84.
Ferreira, I. et al.; "Undoped and doped crystalline silicon films obtained by Nd–YAG laser", Thin Solid Films, 317 (1998) pp. 140–143.
Helen, Y. et al.; "Reproducible High Field . . . Nd:YVO$_4$ Laser Crystallization", 1999 IEEE.
Rezek, B. et al.; "Polycrystalline Silicon Thin . . . Amorphous Silicon", Jpn. J. Appl. Phys., vol. 38 (1999), pp. L1083–1084.

* cited by examiner

*Primary Examiner*—John F. Niebling
*Assistant Examiner*—Stanetta Isaac
(74) *Attorney, Agent, or Firm*—Leydig, Voit & Mayer, Ltd.

(57) ABSTRACT

A process for making a polycrystalline silicon film includes forming, on a glass substrate, an amorphous silicon film having a first region and a second region that contacts the first region, forming a first polycrystalline portion by irradiating the first region of the amorphous silicon film with laser light having a wavelength not less than 390 nm and not more than 640 nm and forming a second polycrystalline portion that contacts the first polycrystalline portion by irradiating the second region and the portion of the region of the first polycrystalline portion that contacts the second region of the amorphous silicon film with the laser light.

12 Claims, 10 Drawing Sheets

PROCESS AND UNIT FOR PRODUCTION OF POLYCRYSTALLINE SILICON FILM

TECHNICAL FIELD

The present invention relates to a process and a unit for production of a polycrystalline silicon film as well as a semiconductor device and a process for the same, in particular, to a process and a unit for production of a polycrystalline silicon film with excellent crystallinity, for making a thin film transistor, having high carrier mobility as a semiconductor device, and a process for the making the semiconductor device and in which the polycrystalline silicon film is used.

BACKGROUND ART

At present, the pixel part of a liquid crystal panel forms images through switching of thin film transistors fabricated with an amorphous or polycrystal silicon film on a substrate of glass or synthesized quartz. In the case that it becomes possible to simultaneously form a driver circuit (at present mainly installed independently outside of the panel) to drive pixel transistors on this panel, there would be great merit with respect to production cost, reliability, and the like, of the liquid crystal panel. At present, however, the crystallinity of the silicon film that forms an active layer of transistors is poor and, therefore, the performance of thin film transistors, represented by mobility, is low and it is difficult to fabricate an integrated circuit wherein high speed and high performance are required. As a method of improving the crystallinity of the silicon film for the purpose of implementing a thin film transistor with a high mobility, heat treatment is, in general, carried out by using a laser.

The relationships between the crystallinity of a silicon film and the mobility of a thin film transistor are described in the following. A silicon film gained through laser heat treatment is, in general, polycrystal. Crystal defects locate in crystal grain boundaries of the polycrystal silicon and they block the carrier movement in the active layer of the thin film transistors. Accordingly, the number of times that the carriers cross the crystal grain boundaries while moving through the active layer becomes less and the concentration of crystal defects becomes lower in order to enhance the mobility of the thin film transistors. The purpose of the laser heat treatment is to form a polycrystal silicon film of which the crystal grain diameters are large and wherein there are fewer crystal defects in the crystal grain boundaries.

FIGS. 18 to 20 are cross sectional views for describing a process for a polycrystal silicon film according to a prior art. First, referring to FIG. 18, a silicon oxide film 32 is formed on a glass substrate 31 by, for example, carrying out CVD (chemical vapor deposition) on a glass substrate. An amorphous silicon film 33 is formed on a silicon oxide film 32 by means of, for example, CVD.

Referring to FIG. 19, an excimer laser (KrF (wavelength: 248 nm)) irradiates an amorphous silicon film 33 in the direction shown by arrow 335. Thereby, the portion irradiated by the excimer laser melts. After that, as the temperature becomes lower, the melted silicon is crystallized so as to form a polycrystal silicon film 334.

Referring to FIG. 20, polycrystal silicon film 334 is patterned so that polycrystal silicon film 334 only remains in portions. Next, a silicon oxide film and a metal film (low resistance metal film such as Ta, Cr or Al) are formed on polycrystal silicon film 334. Gate insulating films 36a and 36b, as well as gate electrodes 37a and 37b, are formed by patterning the metal film and the silicon oxide film. Thereby, active regions 39a and 39b are formed. Next, source and drain regions are formed in a self-aligned manner by means of an ion doping method by using gate electrodes 37a and 37b as a mask. Thereby, the thin film transistors shown in FIG. 20 are completed.

According to a conventional method, as shown in FIG. 19, an amorphous silicon film is polycrystallized by using an excimer laser and, therefore, the mobility of the carriers is low in the transistors formed on the polycrystal silicon film. As a result, a high speed of operation of the transistors is difficult so that it is difficult to achieve a high response of the liquid crystal display device.

In addition, Reference 1 (T. Ogawa, et al., "Thin Film Transistors of Polysilicon Recrystallized by the Second Harmonics of a Q-Switched Nd: YAG Laser" EuroDisplay '99 The 19$^{th}$ International Display Research Conference Late-news papers Sep. 6–9, 1999 Berlin, Germany) discloses an amorphous silicon film made polycrystalline by using, for example, the second harmonic of an Nd: YAG laser as a laser light and a thin film transistor formed by using this polycrystalline film wherein the mobility is increased. However, since the output of the second harmonic of the YAG laser is small, an amorphous silicon film having only a small area can be made polycrystalline. Therefore, the manufacturing of a polycrystalline silicon film for manufacturing a liquid crystal display having a large area is difficult.

Therefore, this invention is provided in order to solve the above described problems.

One purpose of this invention is to provide a process and a unit for manufacturing a polycrystal silicon film that is suitable in the fabrication of a thin film transistor of high performance and that has a large area.

In addition, another purpose of this invention is to provide a thin film transistor of high performance and a process for the same.

DISCLOSURE OF THE INVENTION

A process for a polycrystal silicon film according to this invention is provided with the following steps:

(1) the step of forming an amorphous silicon film having a first region and a second region that contacts this first region on a substrate;

(2) the step of forming a first polycrystal portion by irradiating the first region of the amorphous silicon film with a laser of which the wavelength is not less than 390 nm and not more than 640 nm; and (3) the step of forming a second polycrystal portion that contacts the first polycrystal portion by irradiating the second region of the amorphous silicon film and a portion of the first polycrystal portion that contacts the second region with a laser of which the wavelength is not less than 390 nm and not more than 640 nm.

According to a process for a polycrystal silicon film provided with such steps, first, in the step shown in (2), the first region of the amorphous silicon film is irradiated with a laser so as to form the first polycrystal portion and, after that, the second region of the amorphous silicon film and a portion of the region of the first polycrystal portion are irradiated with a laser so as to form the second polycrystal portion that contacts the first polycrystal portion and, thereby, the first polycrystal portion and the second polycrystal portion can be formed. As a result, the amorphous silicon film can be polycrystallized over a large area so that a polycrystal silicon film having a large area can be formed.

Furthermore, the laser, of which the wavelength is in the above described range, has a large absorption coefficient with respect to amorphous silicon while the absorption ratio with respect to polycrystal silicon is small and, therefore, the amorphous silicon is converted to a polycrystal silicon through the first irradiation and, then, no characteristics are changed due to the second irradiation in the portion that is twice irradiated with the laser. Therefore, there is no difference in the characteristics between the portion irradiated with the laser once and the portion irradiated with the laser twice so that a high quality polycrystal silicon film can be provided.

The reason why the wavelength of the laser is not less than 390 nm is that in the case that the wavelength of the laser is less than 390 nm, the absorption ratio of the polycrystal silicon film exceeds 60% of the absorption ratio of the amorphous silicon film so that the characteristics of the polycrystal silicon film are changed through the second irradiation of the laser, which is not desirable. In addition, the reason why the wavelength of the laser is not more than 640 nm is that in the case that the wavelength of the laser exceeds 640 nm, the absorption ratio of the amorphous silicon becomes 10%, or less, so that the productivity is reduced.

In addition, the step of forming a first polycrystal portion preferably includes the formation of a first polycrystal portion that extends in one direction by scanning the laser on the amorphous silicon film. The step of forming a second polycrystal portion includes the formation of a second polycrystal portion that extends along the first polycrystal portion by scanning the laser in the direction wherein the first polycrystal portion extends.

In this case, since both the first polycrystal portion and the second polycrystal portion are formed by laser scanning, the first and the second polycrystal portions can be formed so as to extend in a predetermined direction. Thereby, the first and the second polycrystal portions can be formed on a substrate of an even larger area.

In addition, the step of forming a first polycrystal portion preferably includes the irradiation of the amorphous silicon film with a first laser of which the wavelength is not less than 390 nm and not more than 640 nm from a first laser light source. The step of forming a second polycrystal portion includes the irradiation of the amorphous silicon film with a second laser of which the wavelength is not less than 390 nm and not more than 640 nm from a second laser light source. In this case, the first polycrystal portion is formed through the irradiation with the laser from the first laser light source while the second polycrystal portion is formed through the irradiation with the laser from the second laser light source and, therefore, the first and the second polycrystal portions can be formed almost simultaneously. Therefore, the productivity of a polycrystal silicon film is increased and a large laser output can be gained in a stable manner.

In addition, the above described laser preferably includes at least one type selected from among a group consisting of the second harmonics of an Nd: YAG laser, the second harmonics of an Nd: YVO$_4$ laser, the second harmonics of an Nd: YLF laser, the second harmonics of an Nd: glass laser, the second harmonics of a Yb: YAG laser, the second harmonics of a Yb: glass laser, an Ar ion laser, the second harmonics of a Ti: sapphire laser and a Dye laser. In this case, these lasers can generate a laser of which the wavelength is not less than 390 nm and not more than 640 nm.

In addition, the process for a polycrystal silicon film includes the irradiation with a laser from the second laser light source at an interval of a predetermined period of time after the irradiation with a laser from the first laser light source. In this case, since the laser from the second laser light source can perform irradiation after the laser from the first laser light source has performed irradiation, the first polycrystal portion and the second polycrystal portion can be formed in sequence. As a result, the production efficiency is further increased.

A production unit for a polycrystal silicon film according to this invention is provided with an oscillation means, an irradiation means, a shifting means and a control means. The oscillation means allows a laser, of which the wavelength is not less than 390 nm and not more than 640 nm to oscillate. The irradiation means irradiates an amorphous silicon film formed on a substrate with a laser that is allowed to oscillator by the oscillation means. The shifting means shifts the substrate relative to the irradiation means. The control means controls the shifting means so that the laser carries out scanning so as to form a first polycrystal portion by irradiating the amorphous silicon film with the laser of which the wavelength is not less than 390 nm and not more than 640 nm and so as to form a second polycrystal portion that contacts the first polycrystal portion by irradiating a portion of the amorphous silicon film that partially overlaps the first polycrystal portion with the laser of which the wavelength is not less than 390 nm and not more than 640 nm.

In such a production unit for a polycrystal silicon film, the control means irradiates the amorphous silicon film with the laser so as to form the first polycrystal portion and irradiates the portion that partially overlaps the first polycrystal portion with the laser so as to form the second polycrystal portion and, therefore, the first and second polycrystal portions can be formed over a broad area. Therefore, a polycrystal silicon film with a broad area can be provided. Furthermore, a laser of which the wavelength is in the above described range has a large absorption ratio with respect to amorphous silicon and has a small absorption ratio with respect to polycrystal silicon so that the portion that is irradiated twice does not change. Therefore, a high quality polycrystal silicon film can be provided.

The reason why the wavelength of the laser is not less than 390 nm is that in the case that the wavelength of the laser is less than 390 nm, the absorption ratio of the polycrystal silicon film exceeds 60% of the absorption ratio of the amorphous silicon film so that the characteristics of the polycrystal silicon film are changed through the second irradiation of the laser, which is not desirable. In addition, the reason why the wavelength of the laser is not more than 640 nm is that in the case that the wavelength of the laser exceeds 640 nm, the absorption ratio of the amorphous silicon becomes 10%, or less, so that the productivity is reduced.

In addition, the irradiation means preferably includes the first irradiation means and the second irradiation means. The amorphous silicon film is irradiated with a portion of the laser that is allowed to oscillate by the oscillation means via the first irradiation means. The amorphous silicon film is irradiated with another portion of the laser that is allowed to oscillate by the oscillation means via the second irradiation means. In this case, the amorphous silicon film can be irradiated with the laser that is allowed to oscillate by one oscillation means via the first irradiation means and the second irradiation means and, therefore, the unit can be manufactured at low cost.

In addition, the control means preferably controls the first and second irradiation means, the oscillation means and the shifting means so that the second irradiation means performs the irradiation with the laser at an interval of a predetermined period of time after the first irradiation means has performed the irradiation with the laser. In this case, the second irradiation means performs the irradiation with the laser after the first irradiation means has performed the irradiation with the laser and, therefore, the first polycrystal portion and the second polycrystal portion can be effectively produced. Therefore, a polycrystal silicon film production unit with a high productivity can be provided.

In addition, the irradiation means preferably includes a first irradiation means and a second irradiation means while the oscillation means includes a first oscillation means and a second oscillation means. The amorphous silicon film is irradiated with a laser that is allowed to oscillate by the first oscillation means via the first irradiation means. The amorphous silicon film is irradiated with a laser that is allowed to oscillate by the second oscillation means via the second irradiation means. In this case, since two oscillation means respectively allow lasers to oscillate, lasers of which the outputs are sufficiently large can be allowed to oscillate in a stable manner so that the first and the second polycrystal portions can be effectively produced.

In addition, the control means preferably controls the first and second irradiation means, the first and second oscillation means as well as the shifting means so that the second irradiation means performs the irradiation with the laser at an interval of a period of time after the first irradiation means has performed the irradiation with the laser. In this case, the second irradiation means can perform the irradiation with the laser after the first irradiation means has performed the irradiation with the laser and, therefore, a polycrystal silicon film can be efficiently produced.

In addition, the oscillation means preferably allows the oscillation of a laser that includes at least one type selected from among a group consisting of the second harmonics of an Nd: YAG laser, the second harmonics of an Nd: YVO$_4$ laser, the second harmonics of an Nd: YLF laser, the second harmonics of an Nd: glass laser, the second harmonics of a Yb: YAG laser, the second harmonics of a Yb: glass laser, an Ar ion laser, the second harmonics of a Ti: sapphire laser and a Dye laser.

A process for a semiconductor device according to this invention is provided with the step of forming, on a substrate, an amorphous silicon film having a first region and a second region that contacts this first region and the step of forming a polycrystal silicon film by irradiating the amorphous silicon film with a laser. The step of forming a polycrystal silicon film includes the step of forming a first polycrystal portion by irradiating the first region of the amorphous silicon film with a laser of which the wavelength is not less than 390 nm and not more than 640 nm and the step of forming a second polycrystal portion that contacts the first polycrystal portion by irradiating the second region as well as the portion of the first polycrystal portion that contacts the second region of the amorphous silicon film with a laser of which the wavelength is not less than 390 nm and not more than 640 nm.

According to such a process, the first region of the amorphous silicon film is irradiated with the laser so as to form the first polycrystal portion and, after that, the second region and the portion of the region of the first polycrystal portion of the amorphous silicon film are irradiated with the laser so as to form the second polycrystal portion that contacts the first polycrystal portion and, therefore, the first polycrystal portion and the second polycrystal portion can be formed. As a result, the amorphous silicon film can be polycrystallized over a broad area so that a polycrystal silicon film of a large area can be formed.

Furthermore, the laser, of which the wavelength is in the above described range, has a large absorption coefficient with respect to amorphous silicon while the absorption ratio with respect to polycrystal silicon is small and, therefore, the amorphous silicon is converted to a polycrystal silicon through the first irradiation and, then, no characteristics are changed due to the second irradiation in the portion that is twice irradiated with the laser. Therefore, there is no difference in the characteristics between the portion irradiated with the laser once and the portion irradiated with the laser twice so that a high quality polycrystal silicon film can be provided.

The reason why the wavelength of the laser is not less than 390 nm is that in the case that the wavelength of the laser is less than 390 nm, the absorption ratio of the polycrystal silicon film exceeds 60% of the absorption ratio of the amorphous silicon film so that the characteristics of the polycrystal silicon film are changed through the second irradiation of the laser, which is not desirable. In addition, the reason why the wavelength of the laser is not more than 640 nm is that in the case that the wavelength of the laser exceeds 640 nm, the absorption ratio of the amorphous silicon becomes 10%, or less, so that the productivity is reduced.

In addition, a semiconductor device according to this invention uses a polycrystal silicon film produced by means of the above described process as an active region. In this case, since a polycrystal silicon film of which the mobility is large and of which the area is large is used as an active region, a semiconductor device of which the area is large and that is of high performance can be provided

BEST MODE FOR CARRYING OUT THE INVENTION

First Embodiment

Figure 1:
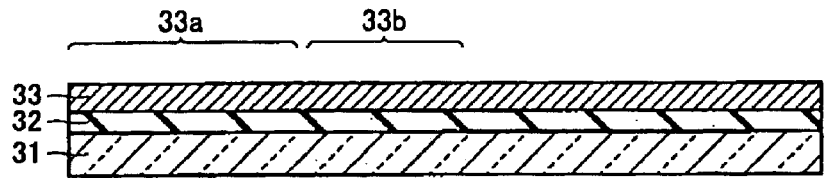
FIG. 1 is a cross sectional view showing the first step of a process for a polycrystal silicon film according to a first embodiment of this invention.

FIGS. 1 to 6 are views showing a process for a polycrystal silicon film according to a first embodiment of this invention. Referring to FIG. 1, a silicon oxide film 32 is formed on a glass substrate 31 by means of, for example, a CVD method. An amorphous silicon film 33 is formed on silicon oxide film 32 by means of a CVD method. This amorphous silicon film 33 has a first region 33a and a second region 33b that contacts this first region 33a.

Figure 2:
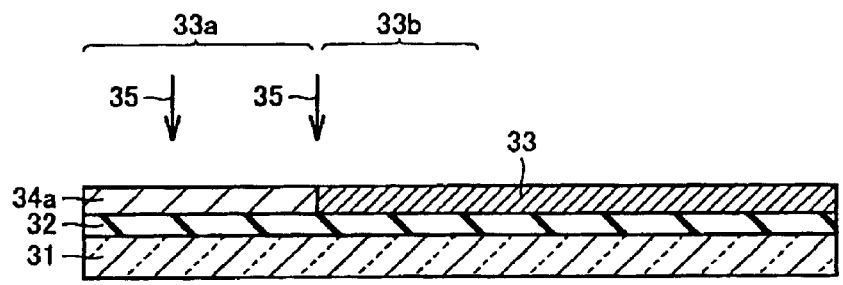
FIG. 2 is a cross sectional view showing the second step of a process for a polycrystal silicon film according to the first embodiment of this invention.
Figure 3:
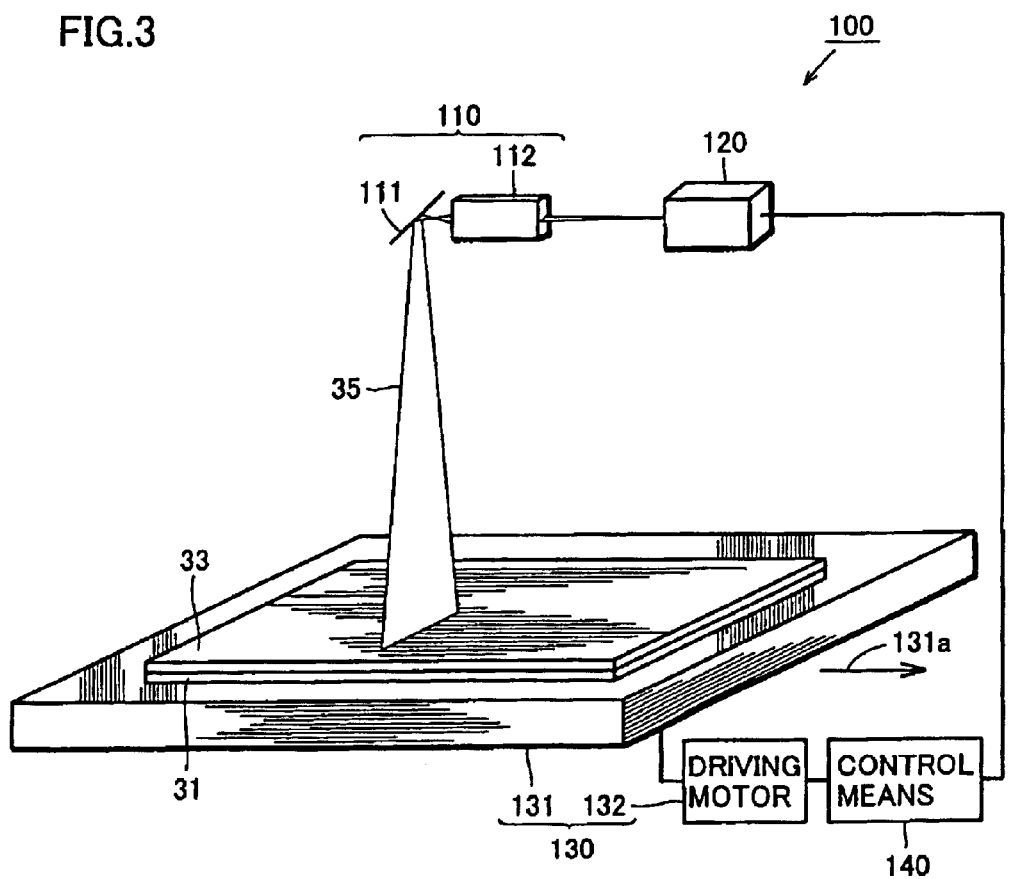
FIG. 3 is a view showing the detail of the step shown in FIG. 2.

Referring to FIGS. 2 and 3, first region 33a of amorphous silicon film 33 is irradiated with the second harmonics laser (wavelength 532 nm) of Nd: YAG of the Q switch. Thereby, a portion irradiated with a laser 35 is polycrystallized so as to form a first polycrystal portion 34a. At this time, a unit, as shown in FIG. 3, is used for the irradiation by the laser.

Referring to FIG. 3, a polycrystal silicon film production unit 100 is provided with a laser oscillator 120 as an oscillation means for oscillating a laser of which the wavelength is not less than 390 nm and not more than 640 nm, an irradiation means 110 for irradiating an amorphous silicon film formed on a substrate with a laser oscillated from laser oscillator 120, a shifting means 130 for shifting a substrate relative to the irradiation means and a control means 140 for controlling the shifting means that forms a first polycrystal portion by irradiating an amorphous silicon film with a laser, of which the wavelength is not less than 390 nm and not more than 640 nm, and that forms a second polycrystal portion that contacts the first polycrystal portion by irradiating the amorphous silicon film with a laser, of which the wavelength is not less than 390 nm and not more than 640 nm, so that the irradiation overlaps a portion of the first polycrystal portion.

Laser oscillator 120 is a Q switch Nd: YAG laser second harmonics oscillator and oscillates a laser so that amorphous silicon film 33 formed on glass substrate 31 is irradiated with this laser via irradiation means 110. Here, the silicon oxide film between glass substrate 31 and amorphous silicon film 33 is omitted in FIG. 3.

Irradiation means 110 is formed of a mirror 111 and a beam formation optical system 112. Beam formation optical system 112 forms the laser beam emitted from laser oscillator 120 into a predetermined form. Then, the laser emitted from beam formation optical system 112 is reflected by mirror 111 so as to irradiate amorphous silicon film 33. Beam formation optical system 112 and mirror 111 are both positioned above amorphous silicon film 33.

Shifting means 130 is formed of a movable stage 131 and a driving motor 132 for driving movable stage 131. Movable stage 131 supports glass substrate 31 and is allowed to shift relative to laser oscillator 120 and irradiation means 110. Therefore, when movable stage 131 moves, glass substrate 31 and amorphous silicon film 33 that are mounted thereon also move.

Movable stage 131 is connected to driving motor 132 so that driving motor 132 drives movable stage 131. Here, movable stage 131 is allowed to shift on a predetermined plane in all directions.

Control means 140 is connected to driving motor 132 and laser oscillator 120. Control means 140 sends a signal to driving motor 132 so that it drives movable stage 131 at a predetermined time. Driving motor 132 that has received this signal shifts movable stage 131 in a predetermined direction. In addition, control means 140 sends a signal to laser oscillator 120 and allows laser oscillator 120 to oscillate a laser.

Control means 140 sends a signal to laser oscillator 120 by using such a unit. Laser oscillator 120 oscillates a laser so as to irradiate first region 33a of amorphous silicon film 33 with this laser via beam formation optical system 112 and mirror 111. Under this condition, control means 140 sends a signal to driving motor 132 so that driving motor 132 shifts movable stage 131 in the direction shown by arrow 131a. Thereby, the portion irradiated with the laser is crystallized so as to form first polycrystal portion 34a.

Figure 4:
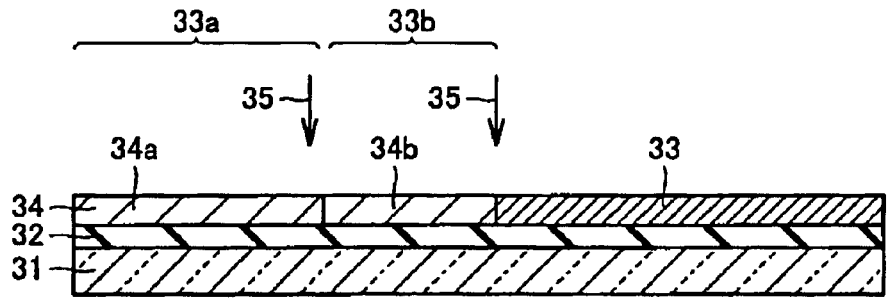
FIG. 4 is a cross sectional view showing the third step of a process for a polycrystal silicon film according to the first embodiment of this invention.
Figure 5:
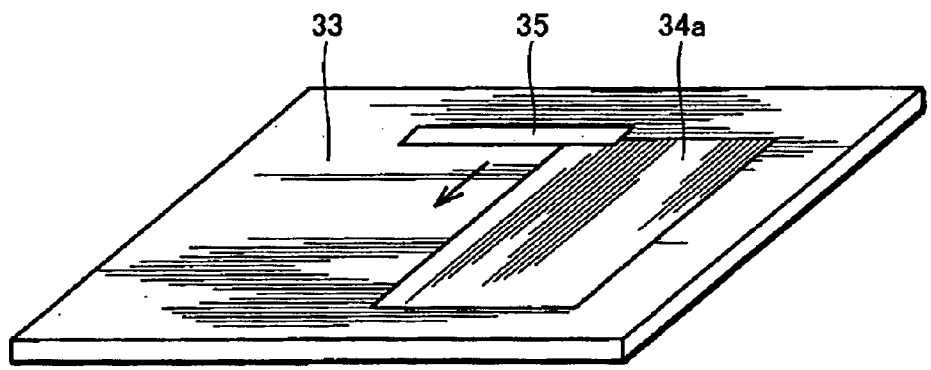
FIG. 5 is a perspective view showing the detail: of the step shown in FIG. 4.

Referring to FIGS. 4 and 5, after first polycrystal portion 34a has been formed, laser oscillator 120 stops oscillating the laser. Movable stage 131 is used to shift amorphous silicon film 33 so that first polycrystal portion 34a and second region 33b are irradiated with laser 35 in a line form. Under this condition, laser 35 is allowed to scan and, thereby, second polycrystal portion 34b is formed.

That is to say, the step of forming first polycrystal portion 34a includes the formation of first polycrystal portion 34a that extends in one direction by allowing laser 35 to scan over amorphous silicon film 33 while the step of forming second polycrystal portion 34b includes the formation of second polycrystal portion 34b that extends along first polycrystal portion 34a by allowing laser 35 to scan in the direction in which first polycrystal portion 34a extends.

By repeating this operation, the major portion of amorphous silicon film 33 is polycrystallized so as to form polycrystal silicon film 34.

Figure 6:
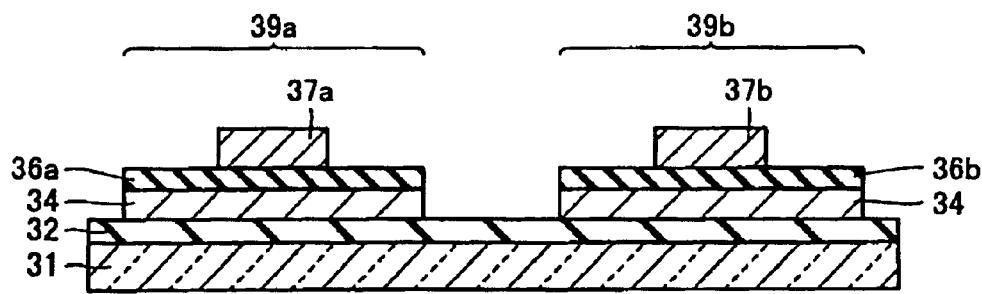
FIG. 6 is a cross sectional view showing the third step of a process for a polycrystal silicon film according to the first embodiment of this invention.

Referring to FIG. 6, polycrystal silicon film 34 is patterned, while leaving out a predetermined portion as polycrystal silicon film 34, so as to form active regions 39a and 39b. Next, a silicon oxide film is formed on polycrystal silicon film 34. A metal film made of a low resistance metal such as Ta, Cr or Al is formed on the silicon oxide film. By patterning the metal film and the silicon oxide film into a predetermined form, gate insulating films 36a and 36b, as well as gate electrodes 37a and 37b, are formed. After that, gate electrodes 37a and 37b are used as a mask to form sources and drains in a self-aligned manner by means of an ion doping method. Thereby, a thin film transistor is completed.

That is to say, in the process for a semiconductor device according to this invention, an amorphous silicon film is formed on glass substrate 31 having first region 33a and second region 33b that is connected to this first region 33a on glass substrate 31. Next, amorphous silicon film 33 is irradiated with a laser so as to form polycrystal silicon film 34. The step of forming polycrystal silicon film 34 includes the steps wherein, first region 33a of amorphous silicon film 33 is irradiated with a laser of which the wavelength is not less than 390 nm and not more than 640 nm so as to form first polycrystal portion 34a and, next, wherein second region 33b of the amorphous silicon film and a region of a portion of first polycrystal portion. 34a that contacts second region 33b are irradiated with a laser of which the wavelength is not less than 390 nm and not more than 640 nm so as to form second polycrystal portion 34b that contacts first polycrystal portion 34a. In addition, the semiconductor device thus gained uses the polycrystal silicon film fabricated in the above described steps as active regions 39a and 39b.

Figure 7:
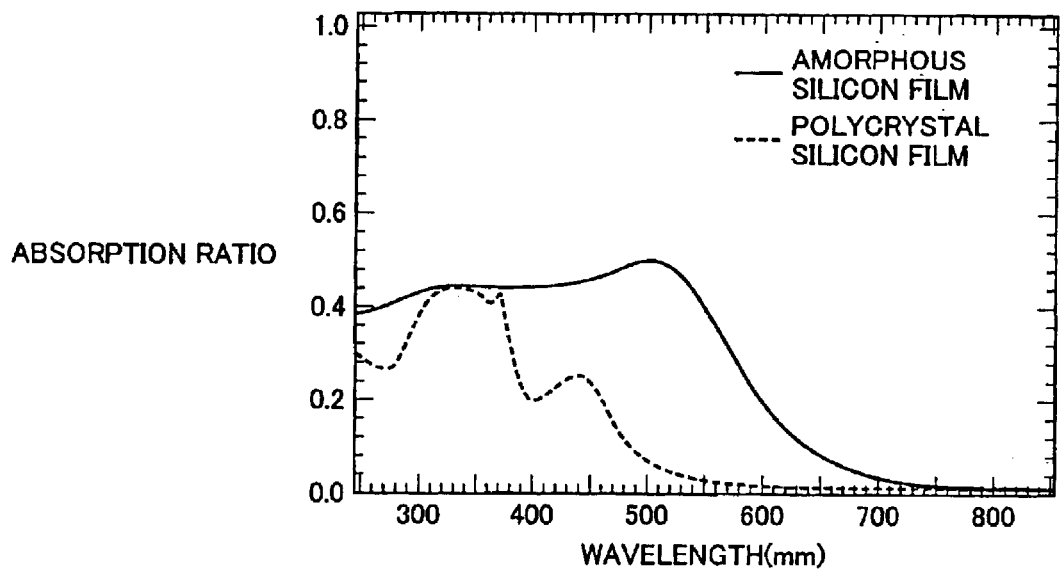
FIG. 7 is a graph showing the relationship between the wavelength of a laser and the absorption ratio with respect to an amorphous silicon film and a polycrystal silicon film.

FIG. 7 is a graph showing the relationships of the wavelength of a laser and the absorption ratio in an amorphous silicon film and in a polycrystal silicon film. Referring to FIG. 7, the absorption ratio of a laser in the amorphous silicon film and in the polycrystal silicon film changes variously depending on the wavelength thereof. Since the wavelength of the laser is not less than 390 nm in the present invention, the absorption ratio of the polycrystal silicon film is 60%, or less, of the absorption ratio of the amorphous silicon film. Therefore, in the case that polycrystal silicon has been formed through laser irradiation of amorphous silicon, such polycrystal silicon does not absorb the energy of the laser even when the polycrystal silicon is irradiated with the laser. As a result, the characteristics of the polycrystal silicon do not vary so that almost the same characteristics can be gained throughout the entirety of the polycrystal silicon film.

In addition, since the wavelength of the laser is not more than 640 nm, the absorption ratio in the amorphous silicon film becomes 10%, or greater. As a result, it becomes easy for the amorphous silicon to absorb the heat from the laser so that the amorphous silicon can be easily polycrystallized.

Here, it is preferable for the wavelength to be not less than 500 nm and not more than 550 nm because the difference in the absorption ratios of the amorphous silicon film and the polycrystal silicon film becomes greater. It is more preferable for the wavelength to be not less than 520 nm and not more than 550 nm because the difference in the absorption ratios of the amorphous silicon film and the polycrystal silicon film becomes particularly great.

Figure 8:
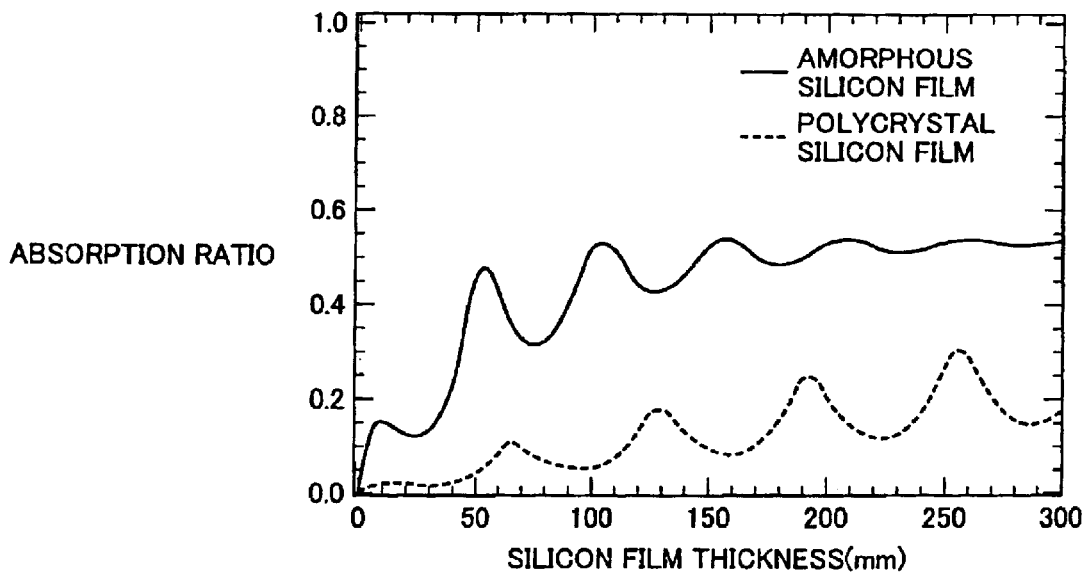
FIG. 8 is a graph showing the relationship between the film thickness of a silicon film and the absorption ratio with respect to an amorphous silicon film and a polycrystal silicon film.

FIG. 8 is a graph showing the relationships between the silicon film thickness and the absorption ratio with respect to the laser (second harmonics of Nd: YAG (wavelength $\lambda=532$ nm)) used in this invention. The absorption ratio of the polycrystal silicon film is smaller than the absorption ratio of the amorphous silicon film in the case that the thickness of the silicon film is set at a variety of values with respect to the laser used in this invention.

Figure 9:
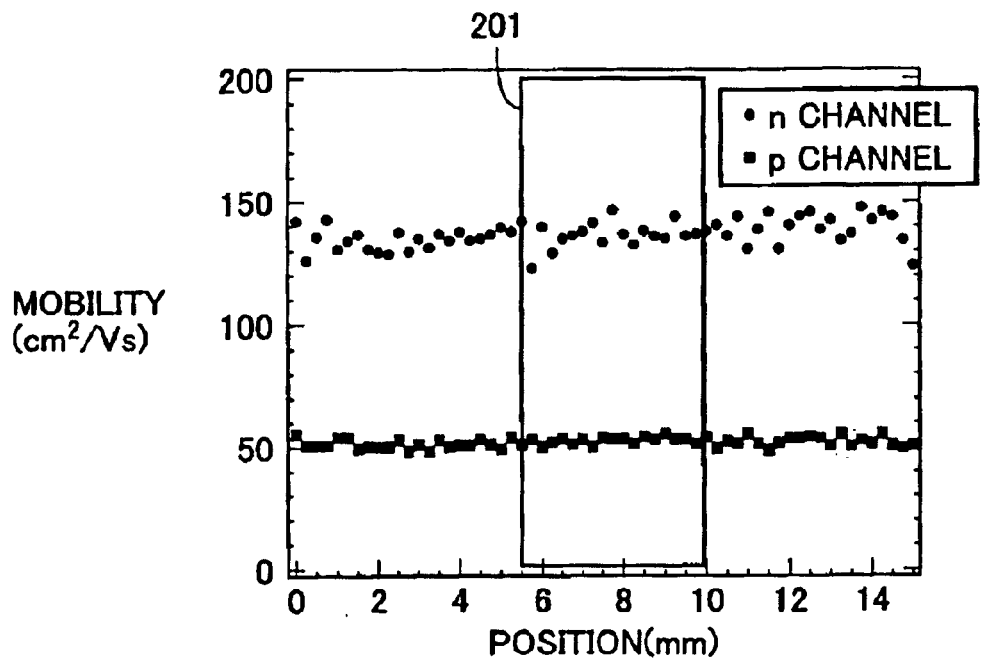
FIG. 9 is a graph showing the relationship between irradiation position and mobility in polycrystalline silicon produced according to this invention.
Figure 10:
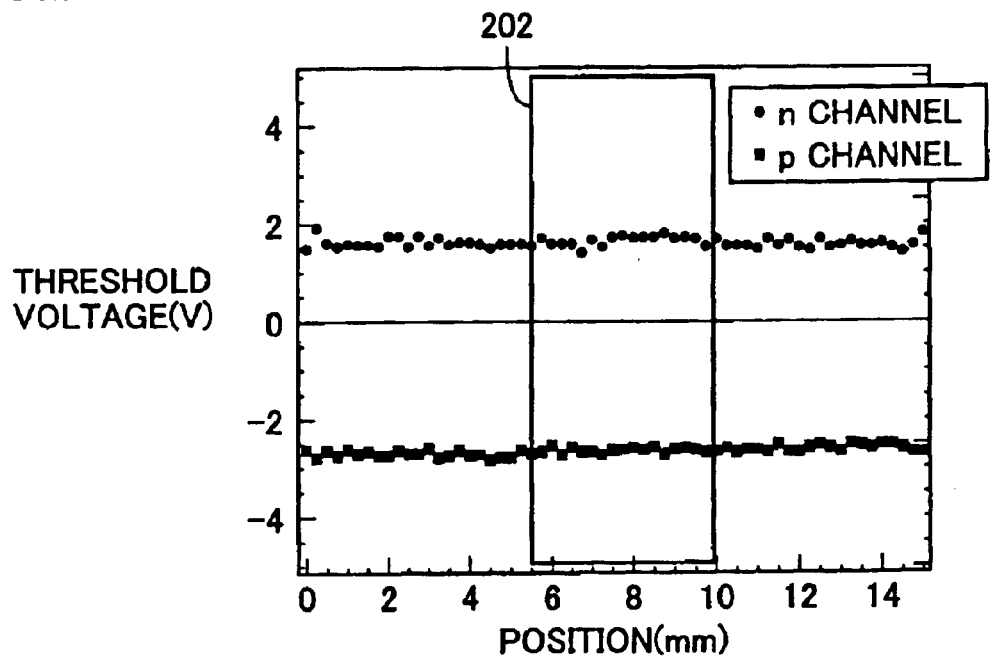
FIG. 10 is a graph showing the relationship between irradiation position of a laser and threshold potential in a polycrystalline silicon film produced according to this invention.

In addition, n channel type and p channel type transistors in the structure shown in FIG. 6 are fabricated and the mobility and the threshold potential in these transistors are shown in FIGS. 9 and 10.

Referring to FIG. 9, the portion surrounded by solid line 201 indicates the portion that is twice irradiated with the laser. It can be understood from FIG. 9 that the mobility is maintained at an approximately constant level in the case that either an n channel type transistor or a p channel type transistor is formed. In addition, it can be understood that the mobility in the portion that is twice irradiated with the laser is approximately the same as that in the other portions.

Referring to FIG. 10, the portion surrounded by solid line 202 is the portion that is twice irradiated with the laser. It can be understood from FIG. 10 that the threshold voltage of either the n channel type transistor or the p channel type transistor is approximately the same in any position. In addition, it can be understood that the threshold potential is approximately the same in the portion that is twice irradiated with the laser and in the portion that is irradiated with the laser only once.

The wavelength of the laser is in an optimal range in the above manner according to the present invention and, therefore, a high quality semiconductor device can be provided wherein the mobility and the threshold potential are constant in both the portion that is once irradiated with the laser as well as in the portion that is twice irradiated with the laser.

That is to say, in the case that a thin film transistor is formed, the thickness of the silicon film is conventionally 100 nm, or less, and in this region the absorption ratios of the amorphous silicon film and of the polycrystal silicon film differ greatly wherein the absorption ratio of the polycrystal silicon film is smaller than the absorption ratio of the amorphous silicon film. As a result, when a polycrystal silicon film is irradiated with a laser having an irradiation energy density that is optimal for amorphous silicon film, the energy absorbed by the polycrystal silicon film is too small to cause the melting of the polycrystal silicon film. That is to say, only the amorphous silicon film portion selectively receives the laser heat processing and, therefore, no difference is caused in the characteristics of the portion that receives laser heat processing twice and the portion that only receives laser heat processing once so that a polycrystal silicon film can be formed of which the characteristics are uniform throughout the region of the substrate. In addition, the same effects can be gained in the case that a polycrystal silicon film that has many crystal defects and of which the absorption high is used as a film that is irradiated with the laser.

Figure 11:
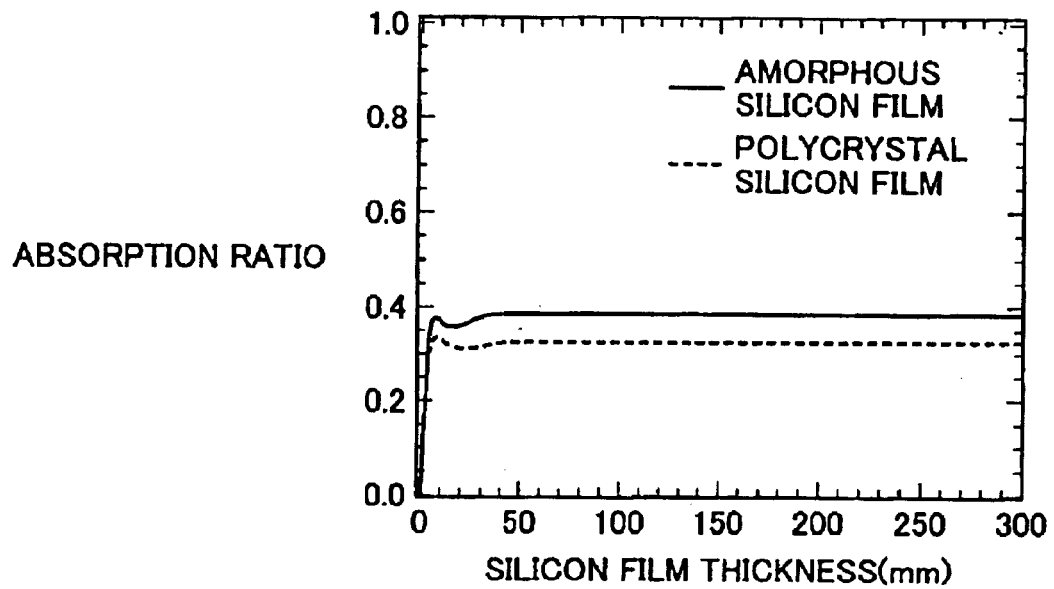
FIG. 11 is a graph showing the relationship between the film thickness and the absorption ratio in an amorphous silicon film and a polycrystal silicon film in the case that a conventional excimer laser is used.

FIG. 11 is a graph showing the relationships between the film thickness and the absorption ratio of a conventional amorphous silicon film and of a polycrystal silicon film fabricated by using an excimer laser. It can be understood from FIG. 11 that the absorption ratios of the polycrystal silicon film and of the amorphous silicon film are approximately the same. Even in the case that such an amorphous silicon film has been converted to a polycrystal silicon film by being irradiated once with a laser, the polycrystal silicon film is again irradiated with a laser afterwards and, thereby, the polycrystal silicon film absorbs the energy of the laser. Thereby, the polycrystal silicon film is again melted so that the characteristics of the polycrystal silicon film change. Therefore, the portion that is once irradiated with the laser and the portion that is twice irradiated with the laser differ in the characteristics of the polycrystal silicon film and a polycrystal silicon film that has uniform characteristics throughout the film cannot be gained.

That is to say, as shown in FIG. 11, in the case that the amorphous silicon film and the polycrystal silicon film are irradiated with a KrF excimer laser beam (wavelength: 248 nm), the difference in absorption ratios of the amorphous silicon film and the polycrystal silicon film is approximately 7%. At the time of laser heat processing of the amorphous silicon film, the irradiation energy density is set at the optimal value of the amorphous silicon film.

Figure 12:
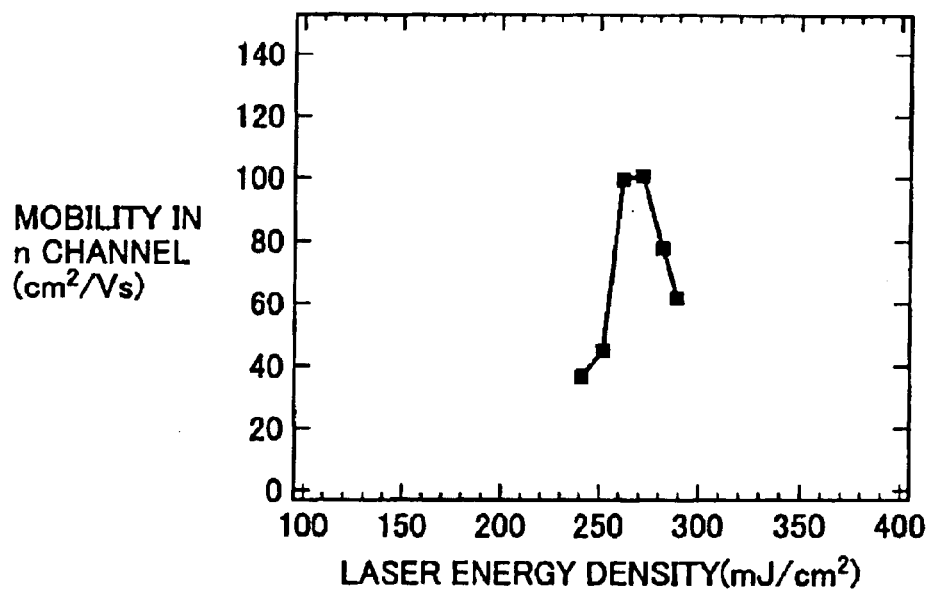
FIG. 12 is a graph showing the laser energy density and the mobility in the case that a polycrystal silicon film is produced using an excimer laser.

FIG. 12 is a graph showing the relationships between the laser energy density and the mobility of the n channel type transistor at the time when the polycrystal silicon film, shown in FIG. 11, is fabricated. As shown in FIG. 12, as for heat processing by means of an excimer laser, the permissible range of the optimal value of the irradiation energy density is very narrow and, therefore, when the absorption ratios differ by 7% it becomes a problem. That is to say, after the polycrystal silicon film portion has been once melted through the irradiation by means of the excimer laser, recrystallization growth occurs and since the irradiation energy density is outside of the permissible range of the optimal value, the region that has undergone a second laser irradiation is converted to a polycrystal silicon film having poor characteristics.

That is to say, the portion that is once irradiated with a laser and the portion that is twice irradiated with a laser in a conventional polycrystal silicon film differ in laser energy density. Therefore, the mobility of the n channel type transistor differs so that uniform characteristics cannot be gained throughout the polycrystal silicon film. As a result, a thin film transistor having the desired characteristics cannot be gained.

Second Embodiment

Figure 13:
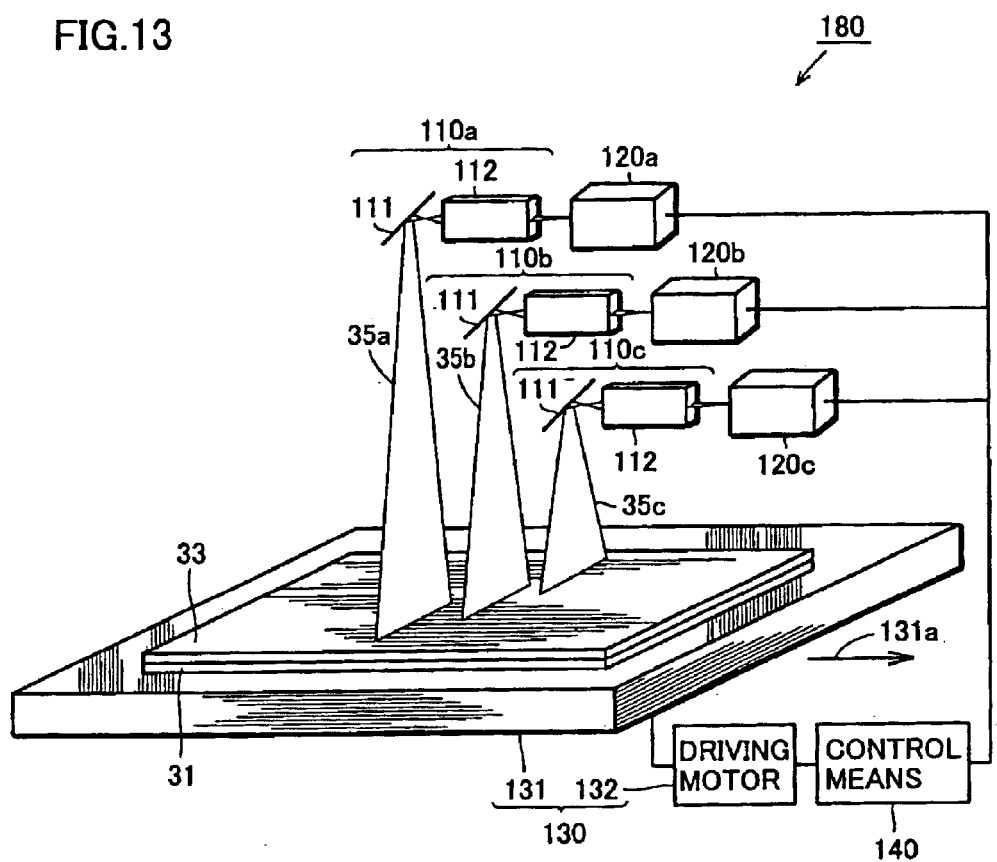
FIG. 13 is a perspective view showing the step of producing a polycrystal silicon film according to a second embodiment of this invention.

FIG. 13 is a perspective view showing a process for a polycrystal silicon film according to a second embodiment of this invention. The irradiation means of a polycrystal silicon film production unit 180, shown in FIG. 13, differs from that of the polycrystal silicon film production unit 100. That is to say, in the polycrystal silicon film production unit 180, shown in FIG. 13, a first irradiation means 110a, a second irradiation means 110b and a third irradiation means 110c exist as the irradiation means. First, second and third irradiation means 110a, 110b and 110c are, respectively, formed of a mirror 111 and a beam formation optical system 112. Mirror 111 and beam formation optical system 112 are similar to those shown in FIG. 3. A laser oscillator 120a, as the first oscillation means, a laser oscillator 120b as the second oscillation means and a laser oscillator 120c as the third oscillation means are connected to respective beam formation optical systems 112. Laser oscillators 120a, 120b and 120c are, respectively, Q switch Nd: YAG laser second harmonics oscillators. Light emitted from, respectively, laser oscillators 120a, 120b and 120c irradiates the beam formation optical system. In addition, laser oscillators 120a, 120b and 120c are respectively connected to control means 140.

A laser oscillated from laser oscillator 120a irradiates amorphous silicon film 33 via first irradiation means 110a. A laser oscillated from laser oscillator 120b irradiates amorphous silicon film 33 via second irradiation means 110b. Control means 140 controls first and second irradiation means 110a and 110b, laser oscillators 120a and 120b as well as shifting means 130 so that second irradiation means 110b emits a laser 35b after a predetermined period of time has elapsed since first irradiation means 110a has emitted a laser 35a.

That is to say, as shown in FIG. 13, amorphous silicon film 33 is irradiated with lasers 35a, 35b and 35c and, under this condition, shifting means 130 allows glass substrate 31 to shift in the direction shown by arrow 131a and, thereby, the surface of amorphous silicon film 33 is irradiated with lasers 35a, 35b and 35c so that a polycrystal silicon film can be formed on amorphous silicon film 33.

Figure 14:
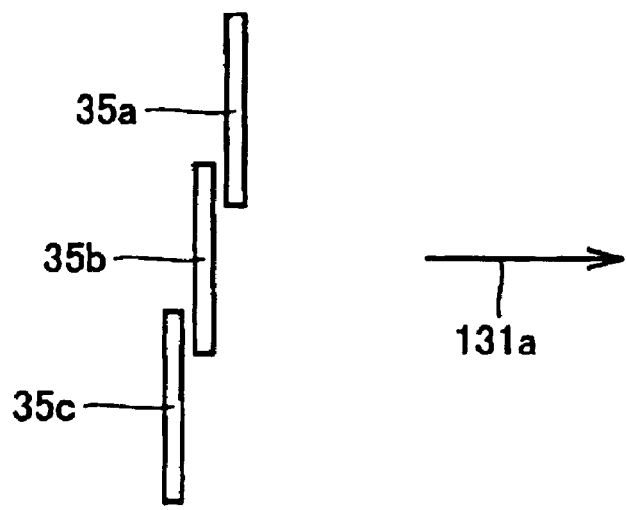
FIG. 14 is a view showing one example of a laser scanning method in FIG. 13.

FIG. 14 is a view showing the appearance of a laser irradiating the amorphous silicon film. Referring to FIG. 14, the positions of the lasers are arranged so that, first, laser 35a becomes the head and is followed by laser 35b which is, in turn, followed by laser 35c relative to the shifting direction of the movable stage shown by arrow 131a.

Figure 15:
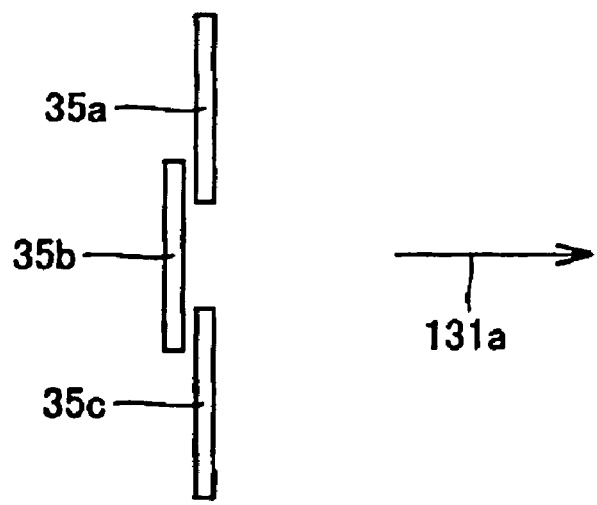
FIG. 15 is a view showing another example of a laser scanning method in FIG. 13.

In addition, referring to FIG. 15, lasers 35a and 35c are arranged so as to be positioned in front toward the direction of progression shown by arrow 131a while laser 35b may be arranged so as to be positioned on the rear side. In these methods the positions of respective beams in line forms are parallel to each other and are staggered and, in addition, the edges of the beams in line forms are slightly overlapped with the edges of the adjacent beams so that the heat processed traces of the adjacent beams overlap each other. A plurality of beams in line forms of such a configuration irradiate, simultaneously or in a time staggered manner, the stage while it is being scanned.

Figure 16:
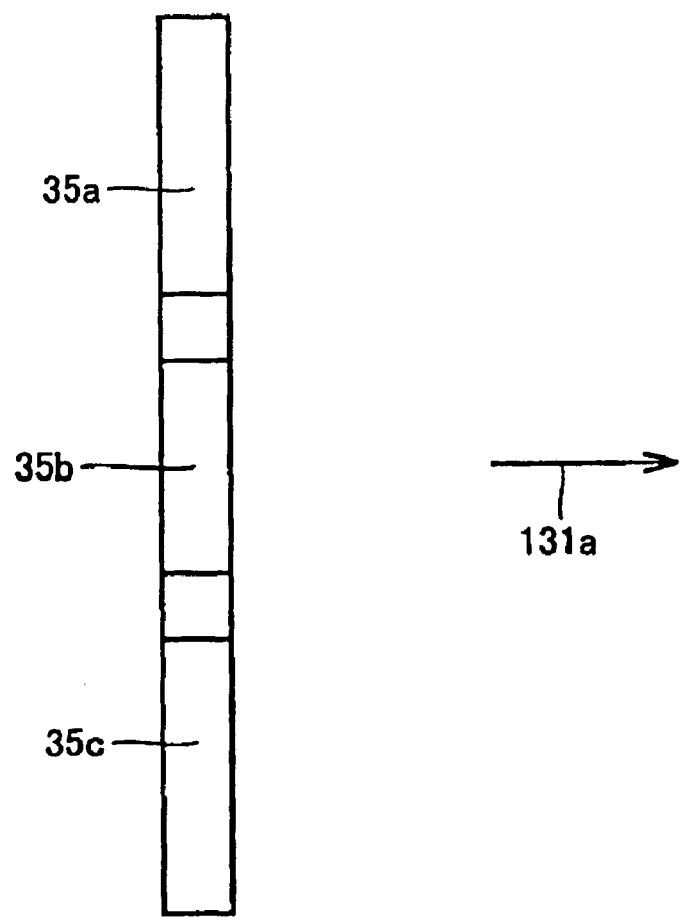
FIG. 16 is a view showing linear beams that overlap.

Furthermore, as shown in FIG. 16, the beams are arranged so that respective lasers 35a, 35b and 35c overlap. In FIG. 16, the respective beams in line forms are connected so as to form a beam in a one line form as shown in the figure. As for the laser irradiation, each of the laser beams irradiates the stage in a time staggered manner so that the adjoining two beams do not simultaneously carry out irradiation while the stage is being scanned.

A semiconductor device that has a polycrystal silicon film can be manufactured by using such a polycrystal silicon film production unit 180 with the same method as the method of the first embodiment. Furthermore, three laser oscillators are used in this unit and, therefore, throughput is increased and a polycrystal silicon film of a broad area can be effectively produced.

Third Embodiment

Figure 17:
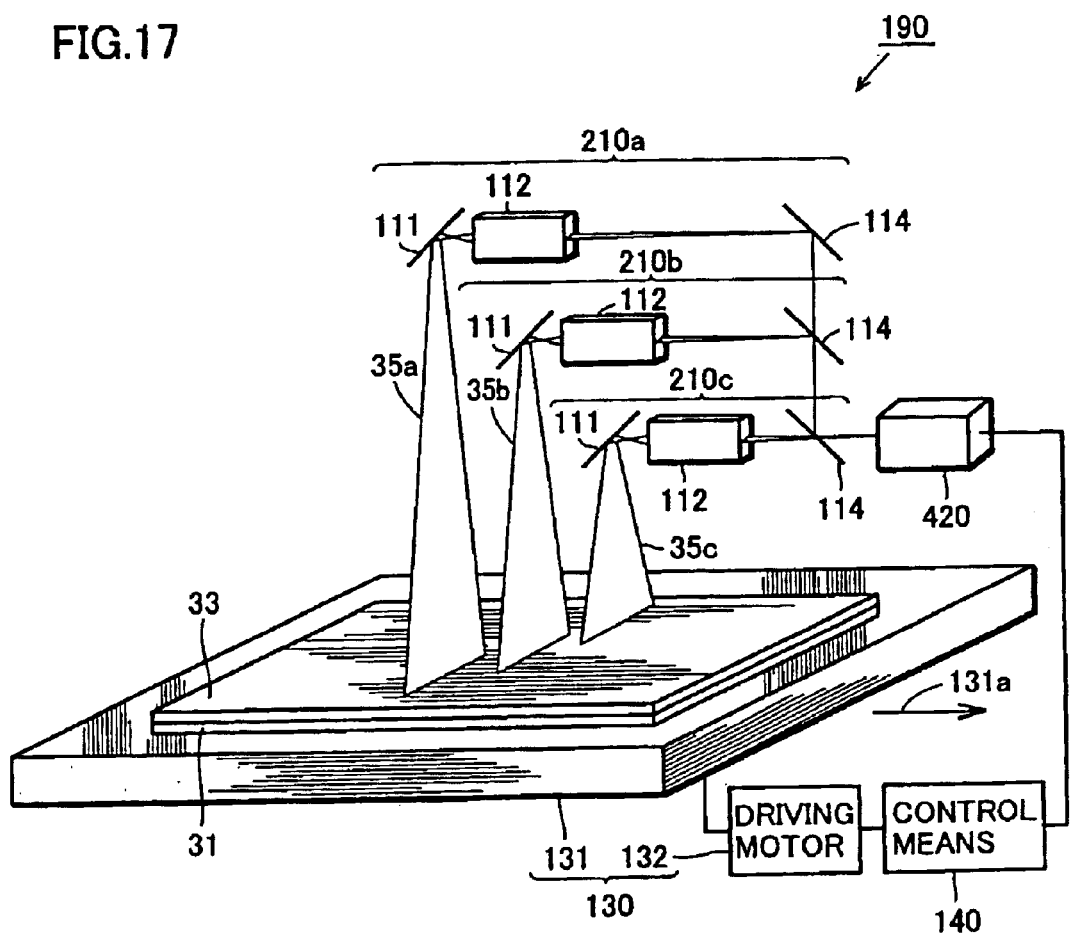
FIG. 17 is a view showing a process for a polycrystal silicon film according to a third embodiment of this invention.
Figure 18:
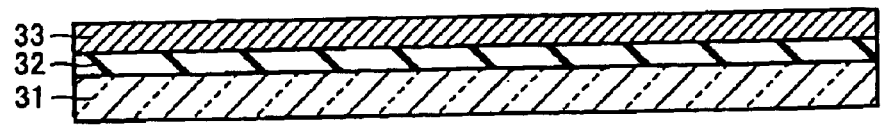
FIG. 18 is a cross sectional view showing the first step of a process for a polycrystal silicon film according to a prior art.
Figure 19:
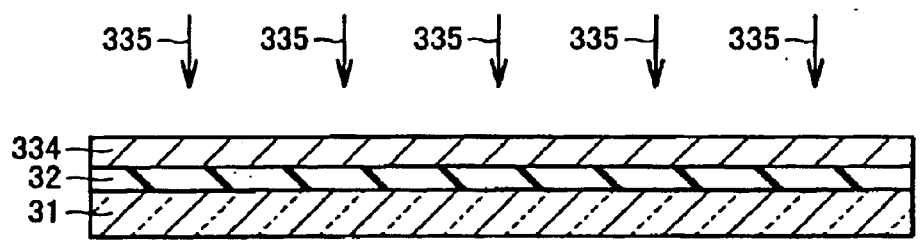
FIG. 19 is a cross sectional view showing the second step of a process for a polycrystal silicon film according to the prior art.
Figure 20:
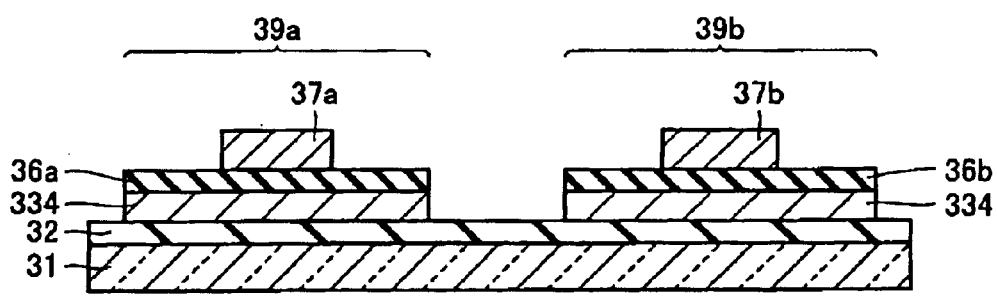
FIG. 20 is a cross sectional view showing the third step of a process for a polycrystal silicon film according to the prior art.

FIG. 17 is a perspective view of a production unit for a polycrystal silicon film according to a third embodiment of this invention. Referring to FIG. 17, a polycrystal silicon film production unit 190 according to the third embodiment differs from that of other embodiments in the point that a laser oscillated from one laser oscillator 420 is used by three irradiation means. That is to say, the irradiation means has a first irradiation means 210a, a second irradiation means 210b and a third irradiation means 210c. Irradiation means 210a, 210b and 210c have, respectively, a beam formation optical system 112 and a mirror 111 that are the same as those in the first embodiment. The mirror 114 reflects a laser that is oscillated by laser oscillator 420 of which the wavelength is not less than 390 nm and not more than 640 nm so that amorphous silicon film 33 is irradiated with this laser in the form of lasers 35a, 35b and 35c via beam formation optical systems 112 and mirrors 111. That is to say, in this polycrystal silicon film production unit 190 the irradiation means includes first irradiation means 210a and second irradiation means 210b. Amorphous silicon film 33 is irradiated with a portion of the laser oscillated from laser oscillator 420 via first irradiation means 210a. Amorphous silicon film 33 is irradiated with another portion of the laser oscillated from laser oscillator 420 via second irradiation means 210b. In addition, control means 140 controls first and second irradiation means 210a and 210b, laser oscillator 420 as well as shifting means 130 so that second irradiation means 210b carries out a laser irradiation after a predetermined period of time has passed since first irradiation means 210a has carried out a laser irradiation.

Nd: YAG second harmonics (wavelength: 532 nm) lasers emitted from laser oscillator 420 are formed to have beam profiles in line forms by means of beam formation optical systems 112 that correspond to respective lasers.

Such a method also has the same effect as in the first embodiment. Furthermore, the unit can be formed of one laser oscillator 420 so that the cost of the unit can be reduced.

In addition to the above description of the embodiments of this invention, it is possible to modify the embodiments shown herein in a variety of manners. First, a laser irradiation method as shown in FIGS. 14 to 16 of the second embodiment can be used in the unit shown in FIG. 17. Furthermore, in addition to the means for oscillating the second harmonics of an Nd: YAG laser that is shown as a laser oscillator, other laser oscillators such as laser oscillators that oscillate the second harmonics of an Nd: $YVO_4$ laser, the second harmonics of an Nd: YLF laser, the second harmonics of an Nd: glass laser, the second harmonics of a Yb: YAG laser, the second harmonics of a Yb: glass laser, an Ar ion laser, the second harmonics of a Ti: sapphire laser or a Dye laser may be used.

Industrial Applicability

This invention can be utilized in the field of a process for thin film transistors that are used in a liquid crystal display.

What is claimed is:

1. A process for making a polycrystalline silicon film comprising:

forming an amorphous silicon film having a first region and a second region that partially overlaps the first region, on a substrate;

condensing a laser beam having a wavelength not shorter than 390 nm and not loner than 640 nm to form a linear laser beam;

forming a first polycrystalline portion by scanning the first region of the amorphous silicon film with the linear laser beam in a single scan direction so that the first polycrystalline portion extends in the scan direction; and forming a second polycrystalline portion that partially overlaps the first polycrystalline portion by scanning the second region of the amorphous silicon film and the part of the first region that overlaps the second region with the linear laser beam so that the second polycrystalline portion extends in the scan direction and is substantially parallel to the first polycrystalline portion.

2. The process for making a polycrystalline silicon film according to claim 1, wherein forming the first polycrystalline portion includes irradiating the first region of the amorphous silicon film with a first linear laser beam having a wavelength not shorter than 390 nm and not longer than 640 nm from a first laser light source and forming the second polycrystalline portion includes irradiating the first region of the amorphous silicon film with a second linear laser beam having a wavelength not shorter than 390 nm and not longer than 640 nm from a second laser light source.

3. The process for making a polycrystalline silicon film according to claim 1, wherein the linear laser beam is selected from the group consisting of second harmonic light of an Nd:YAG laser, second harmonic light of an Nd:$YVO_4$ laser, second harmonic light of an Nd:YLF laser, second harmonic light of an Nd:glass laser, second harmonic light of a Yb:YAG laser, second harmonic light of a Yb:glass laser, light of an Ar ion laser, second harmonic of a Ti:sapphire laser, and light of a dye laser.

4. The process for making a polycrystalline silicon film according to claim 2, including irradiating with the second linear laser beam from the second laser light source after a fixed period of time has elapsed after irradiation with the first linear laser beam from the first laser light source.

5. A production unit for producing a polycrystalline silicon film comprising:

oscillation means for producing a laser beam having a wavelength not shorter than 390 nm and not longer than 640 nm;

irradiation means for condensing the laser beam to form a linear laser beam and irradiating an amorphous silicon film on a substrate with the linear laser beam;

shifting means for shifting the substrate relative to said irradiation means; and control means for controlling said shifting means so the linear laser beam scans the amorphous silicon film so that a first polycrystalline portion is formed by scanning a first region of the amorphous silicon film in a scan direction with the linear laser beam, that a second polycrystalline portion having a part overlapping said first polycrystalline portion is formed by scanning the part of the first polycrystalline silicon portion that overlaps the second polycrystalline portion and a second region of the amorphous silicon film with the linear laser beam in the scan direction, and the first and second polycrystalline portions extend in the scan direction and are substantially parallel to each other.

6. The production unit for producing a polycrystalline silicon film according to claim 5, wherein said irradiation means includes first irradiation means and second irradiation means;

the amorphous silicon film is irradiated with a first portion of the linear laser beam from said oscillation means via said first irradiation means; and the amorphous silicon film is irradiated with a second portion of the linear laser beam from said oscillation means via said second irradiation means.

7. The production unit for producing a polycrystalline silicon film according to claim 6, wherein said control means controls said first and second irradiation means, said oscillation means, and said shifting means so that said second irradiation means provides irradiation by a second linear laser beam after a fixed period of time has elapsed since said first irradiation means has provided irradiation by a first linear laser beam.

8. The production unit for producing a polycrystalline silicon film according to claim 5, wherein said irradiation means includes first irradiation means and second irradiation means and said oscillation means includes first oscillation means and second oscillation means;

the amorphous silicon film is irradiated with a first linear laser beam from said first oscillation means via said first irradiation means; and the amorphous silicon film is irradiated with a second linear laser beam from said second oscillation means via said second irradiation means.

9. The production unit for producing a polycrystalline silicon film according to claim 8, wherein said control means controls said first and second irradiation means, said first and second oscillation means, and said shifting means so that said second irradiation means provides irradiation by the second linear laser beam after a fixed period of time has elapsed since said first irradiation means has provided irradiation by the first linear laser beam.

10. The production unit for producing a polycrystalline silicon film according to claim 5, wherein said oscillation means produces the linear laser beam that includes at least one selected from the group consisting of second harmonic light of an Nd:YAG laser, second harmonic light of an Nd:YVO$_4$ laser, second harmonic light of an Nd:YLF laser, second harmonic light of an Nd:glass laser, second harmonic light of a Yb:YAG laser, second harmonic light of a Yb:glass laser, light of an Ar ion laser, second harmonic light of a Ti:sapphire laser, and light of a dye laser.

11. A process for producing a semiconductor device, comprising:

forming an amorphous silicon film having a first region and a second region that partially overlaps the first region, on a substrate;

condensing a laser beam having a wavelength not shorter than 390 nm and not longer than 640 nm to form a linear laser beam; and forming a polycrystalline silicon film by scanning the amorphous silicon film with the linear laser beam, wherein forming the polycrystalline silicon film includes forming a first polycrystalline portion by scanning the first region of the amorphous silicon film with the linear laser beam in a single scan direction so that the first polycrystalline portion extends in the scan direction, and forming a second polycrystalline portion that partially overlaps the first polycrystalline portion by scanning the second region of the amorphous silicon film and the portion of the first region that overlaps the second region with the linear laser beam so that the second polycrystalline portion extends in the scan direction and is substantially parallel to the first polycrystalline portion.

12. A semiconductor device wherein a polycrystalline silicon file produced according to claim 11 is used for active regions.

* * * * *

UNITED STATES PATENT AND TRADEMARK OFFICE
CERTIFICATE OF CORRECTION

PATENT NO. : 6,884,699 B1
DATED : April 26, 2005
INVENTOR(S) : Ogawa et al.

It is certified that error appears in the above-identified patent and that said Letters Patent is hereby corrected as shown below:

Title page,
Item [54], Title, should read -- PROCESS AND UNIT FOR PRODUCTION OF POLYCRYSTALLINE SILICON FILM, SEMICONDUCTOR DEVICE, AND PROCESS FOR PRODUCTION OF THE SEMICONDUCTOR DEVICE --.

Signed and Sealed this

Seventh Day of February, 2006

JON W. DUDAS
*Director of the United States Patent and Trademark Office*